(12) United States Patent  
Schierling (10) Patent No.: US 11,879,929 B2  
(45) Date of Patent: Jan. 23, 2024

(54) METHOD AND DEVICE FOR AUTOMATICALLY TESTING A SWITCHING MEMBER

(71) Applicant: Siemens Aktiengesellschaft, Munich (DE)

(72) Inventor: Hubert Schierling, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 86 days.

(21) Appl. No.: 17/426,282

(22) PCT Filed: Feb. 12, 2020

(86) PCT No.: PCT/EP2020/053541  
§ 371 (c)(1),  
(2) Date: Jul. 28, 2021

(87) PCT Pub. No.: WO2020/165213  
PCT Pub. Date: Aug. 20, 2020

(65) Prior Publication Data  
US 2021/0389363 A1 Dec. 16, 2021

(30) Foreign Application Priority Data  
Feb. 15, 2019 (EP) .................................. 19157462

(51) Int. Cl.  
*G01R 31/26* (2020.01)  
*G01R 31/327* (2006.01)

(52) U.S. Cl.  
CPC ..... *G01R 31/2621* (2013.01); *G01R 31/2608* (2013.01); *G01R 31/3275* (2013.01)

(58) Field of Classification Search  
CPC ............ G01R 31/2608; G01R 31/2621; G01R 31/3275; G01R 31/318357  
See application file for complete search history.

(56) References Cited

U.S. PATENT DOCUMENTS

2009/0212975 A1 8/2009 Ausman et al.  
2012/0112775 A1 5/2012 Domes  
(Continued)

FOREIGN PATENT DOCUMENTS

CN 102468837 A 5/2012  
CN 104734681 A 6/2015  
(Continued)

OTHER PUBLICATIONS

PCT International Search Report and Written Opinion of International Searching Authority dated May 11, 2020 corresponding to PCT International Application No. PCT/EP2020/053541 filed Feb. 12, 2020.

*Primary Examiner* — Son T Le  
*Assistant Examiner* — Adam S Clarke  
(74) *Attorney, Agent, or Firm* — Harness, Dickey & Pierce, P.L.C.

(57) ABSTRACT

A method is for testing the functionality of a switching member including at least one switching element. A switching state is influenced via a control input of the switching element and via a control signal generated and output to the control input. An activation signal is output to the control unit and changes the control signal. The activation signal induces a test signal as the change to the control signal and induces a disconnection pulse as the test signal. The SiC or GaN power semiconductor is switched off via the disconnection pulse and conducts current in the reverse direction. In response to the disconnection pulse, the voltage drop is recorded. A comparison is carried out between an indicator and a reference encoding an expected response to the disconnection pulse. Depending on the result of the comparison, a status signal is generated which encodes the functionality of the switching member.

2 Claims, 3 Drawing Sheets

(56) References Cited

U.S. PATENT DOCUMENTS

| | | | |
|---|---|---|---|
| 2015/0180463 A1 | 6/2015 | Peltonen | |
| 2015/0247892 A1* | 9/2015 | Robertazzi | G01R 31/2855 |
| | | | 324/762.02 |
| 2016/0011266 A1 | 1/2016 | Osanai | |
| 2016/0124040 A1 | 5/2016 | Bakran | |
| 2017/0187367 A1 | 6/2017 | Ratz | |
| 2017/0336475 A1* | 11/2017 | Wortberg | G01R 31/3278 |
| 2017/0350934 A1* | 12/2017 | Sathik | H02M 7/217 |
| 2018/0323776 A1 | 11/2018 | Bange et al. | |
| 2018/0372552 A1 | 12/2018 | Raut | |
| 2019/0377023 A1* | 12/2019 | Yao | G01K 7/427 |

FOREIGN PATENT DOCUMENTS

| | | |
|---|---|---|
| CN | 105305780 A | 2/2016 |
| CN | 105324675 A | 2/2016 |
| CN | 106662611 A | 5/2017 |
| CN | 109120138 A | 1/2019 |
| DE | 102015204343 A1 | 9/2016 |
| DE | 102015222990 A1 | 5/2017 |
| KR | 20170121466 A | 11/2017 |

* cited by examiner

METHOD AND DEVICE FOR AUTOMATICALLY TESTING A SWITCHING MEMBER

PRIORITY STATEMENT

This application is the national phase under 35 U.S.C. § 371 of PCT International Application No. PCT/EP2020/053541 which has an International filing date of Feb. 12, 2020, which claims priority to EP application number EP19157462 filed Feb. 15, 2019, the entire contents of each of which are hereby incorporated herein by reference.

FIELD

Embodiments of the present application generally relate to a functional monitoring of a switching member and in this respect, a method and a device for automatically testing the functionality of a switching member comprising at least one switching element. A switching member refers here and in the following to a switching and protection device, namely a switching and protection member, which is connected upstream of a consumer connected to a power supply, in particular a DC power supply, or to a power supply branch/load range with a plurality of consumers. Such a switching and protection device comprises at least one electrically switchable switching element, and disconnects the consumer or the load range from the supply side in the event of a fault. This is the protective function of the switching and protection device. Similarly, the switching and protection device can also be used to switch off the or each consumer connected to the switching and protection device as well as the load range supplied via the switching and protection device, via a switching command acting on the switching and protection device. This is the switching function of the switching and protection device.

The functionality of such a switching member is essential for the availability of a system with at least one such switching member, i.e. a power supply, in particular a DC power supply.

BACKGROUND

Previously, a failure of a switching member has been considered a residual risk. Thus, it is accepted that in the event of a fault, a large part of a plant with the consumers connected to the respective power supply will fail, for example, because switching members of parallel load ranges and/or switching members positioned higher within the hierarchy of the supply network will respond due to the failure of a switching member.

SUMMARY

One embodiment of the invention specifies a method for automatically testing the functionality of a switching member comprising at least one electrically switchable switching element. Another embodiment of the present invention specifies a device for automatically testing a switching member, namely for automatically testing the functionality of a switching member comprising at least one electrically switchable switching element.

Embodiments are directed to a test method and a test device designed for automatically testing the functionality of a switching member.

In an embodiment, a method is for automatically testing the functionality of a switching member comprising at least one electrically switchable switching element, a SiC power semiconductor or a GaN power semiconductor acts as the switching element. A switching state of the or each switching element is influenced by a control input of the switching element and by a control signal which is generated by a control unit and output to the control input. An activation signal is output to the control unit, which causes a change to the control signal, wherein the activation signal induces a test signal as the change to the control signal and a disconnection pulse as the test signal. The SiC power semiconductor or GaN power semiconductor is switched off via the disconnection pulse, while the former is conducting current in the reverse direction. The voltage drop induced across the SiC power semiconductor or GaN power semiconductor in response to the disconnection pulse is recorded. A comparison is carried out between an indicator encoding the recorded voltage drop across the SiC power semiconductor or GaN power semiconductor and a reference encoding an expected response to the disconnection pulse. Depending on the result of the comparison, a status signal is generated which encodes the functionality of the switching member.

The method (test method) is preferably carried out via a test device as described here and in the following. In such a method carried out via the test device, an activation signal is output to the control unit by the test device, which causes a change to the control signal. Furthermore, a response to a modified control signal is detected via the test device, in particular via a measuring unit. Furthermore, the test device, in particular an evaluation unit, performs a comparison between an indicator encoding the recorded response to the modified control signal and a reference encoding an expected response to the modified control signal. Finally, depending on the result of the comparison the test device, in particular the evaluation unit, generates a status signal which encodes the functionality of the switching member.

The test device interacts with the switching member to be tested and is an optional component of the switching member, for example by combining the test device with the control unit of the switching member. Such a switching member comprises at least one electrically switchable switching element of the above type, a control unit and a test device as described here and below. A switching state of the or each switching element can be influenced by a control input of the switching element and by a control signal that can be generated by a control unit and output to the control input. The test device can output an activation signal to the control unit, which causes a change to the control signal. The test device, in particular a measuring unit, can also record a response to a modified control signal. Furthermore, the test device, in particular an evaluation unit, can also perform a comparison between an indicator encoding the recorded response to the modified control signal and a reference encoding an expected response to the modified control signal. Finally, depending on the result of the comparison, the test device, in particular the evaluation unit, can generate a status signal which encodes the functionality of the switching member.

BRIEF DESCRIPTION OF THE DRAWINGS

In the following an example embodiment of the invention is explained in more detail based on the drawing. Equivalent objects or components are assigned the same reference signs in all figures.

DETAILED DESCRIPTION OF EXAMPLE EMBODIMENTS

In an embodiment, a method is for automatically testing the functionality of a switching member comprising at least one electrically switchable switching element, a SiC power semiconductor or a GaN power semiconductor acts as the switching element. A switching state of the or each switching element is influenced by a control input of the switching element and by a control signal which is generated by a control unit and output to the control input. An activation signal is output to the control unit, which causes a change to the control signal, wherein the activation signal induces a test signal as the change to the control signal and a disconnection pulse as the test signal. The SiC power semiconductor or GaN power semiconductor is switched off via the disconnection pulse, while the former is conducting current in the reverse direction. The voltage drop induced across the SiC power semiconductor or GaN power semiconductor in response to the disconnection pulse is recorded. A comparison is carried out between an indicator encoding the recorded voltage drop across the SiC power semiconductor or GaN power semiconductor and a reference encoding an expected response to the disconnection pulse. Depending on the result of the comparison, a status signal is generated which encodes the functionality of the switching member.

One advantage of an embodiment of the present invention is that in the case of a switching member with at least one SiC or GaN power semiconductor as the switching element, the current can flow through the switching element in the reverse direction and the voltage drop across the switching element depends on whether the switching element is activated or not. In the case of a SiC-MOSFET as the switching element, the current flows in the reverse direction in the activated state via the channel, otherwise it flows via the body diode. The voltage drop across the body diode of a SiC-MOSFET is around 3 V and is thus significantly higher than the voltage drop across the channel of the MOSFET, assuming a standard design. In this case, the voltage drop on a GaN transistor is approximately 5 V to 10 V. It is particularly advantageous that these voltages are only weakly dependent on the amount of current flowing in the reverse direction.

The current direction and the voltage drop across the switching element are evaluated as part of the test. The transistor that carries current in the reverse direction receives a disconnection pulse. Then, two different cases can occur. Case 1: the transistor is functional and therefore controllable, here: it can be switched off; as a result, the current is commuted to the intrinsic body diode of the SiC-MOSFET or in the case of a GaN transistor gives rise to a higher voltage drop. Case 2: the transistor cannot be controlled, here: it cannot be switched off; thus the voltage drop across the SiC or GaN power semiconductor remains constant. The voltage drop present after a disconnection pulse is tested via an evaluation unit.

Therefore, an embodiment of the invention provides a test of functionality that can be performed during ongoing operation, i.e. during an uninterrupted current flow through the SiC or GaN power semiconductor. Also, since the current flow is maintained there is no time pressure to terminate the functional test quickly. An embodiment of the present invention thus allows a functionality test to be carried out without time pressure. In addition, the voltage with a range of values from 3 to 10 Volts applied to the transistor, to be determined by measurement, is sufficiently high as to be simply and unambiguously detected.

For SiC-MOSFETs, which due to their small forward resistance are particularly well suited for use in a switching member of the type described here, a test of each switching device is therefore always possible regardless of the current direction. With a GaN power semiconductor as the switching element, the current can also flow in the reverse direction and in this operational case the voltage drop with an on-signal applied at the control input of the GaN power semiconductor is less than it is when no on-signal is applied at the control input of the GaN power semiconductor. GaN power semiconductors therefore behave similarly to SiC-MOSFETs and can be monitored in the same way.

The switching member comprises at least one electrically switchable switching element. The switching member comprises electrically switchable power semiconductor switches as switching elements. A switching state of the or each switching element can be influenced by a control input of the switching element and by a control signal generated by a control unit and output to the control input, and is influenced by a control signal generated by the control unit and output to the control input during operation of the switching member; the switching element is switched to an open or closed state via the control signal.

With regard to the test device designed for automatically testing the functionality of a switching member, i.e. a device for carrying out the method for automatically testing the functionality of a switching member comprising at least one switching element, in which a SiC power semiconductor or a GaN power semiconductor acts as the switching device, hereafter referred to as the test device, it is provided that the test device can output an activation signal to the control unit which causes a change to the control signal, that the test device, in particular a measuring unit, can record a response to a modified control signal, that the test device, in particular an evaluation unit, can perform a comparison between an indicator encoding the recorded response to the modified control signal and a reference encoding an expected response to the modified control signal, and that the test device, in particular the evaluation unit, can generate a status signal as a function of the result of the comparison, which encodes the functionality of the switching member. The test device is configured to switch off the SiC power semiconductor or the GaN power semiconductor via the disconnection pulse while the former conducts current in the reverse direction.

In detail, the test device is designed such that a switching state of the or each switching element is influenced via a control input of the switching element and via a control signal that can be generated by a control unit and output to the control input, the test device can output an activation signal to the control unit which changes the control signal, wherein the activation signal induces a test signal as the change to the control signal and induces a disconnection pulse as the test signal, wherein the SiC power semiconductor or the GaN power semiconductor can be switched off via the disconnection pulse while the former conducts current in the reverse direction, wherein in response to the disconnection pulse the test device can record the voltage drop across the SiC power semiconductor or GaN power semiconductor, wherein the test device can perform a comparison between an indicator encoding the recorded voltage drop across the SiC power semiconductor or GaN power semiconductor and a reference encoding an expected response to the modified control signal and wherein on the basis of the result of the comparison, the test device can generate a status signal which encodes the functionality of the switching member. The test device is configured to switch off the SiC power semiconductor or GaN power semiconductor via the disconnection pulse while the former conducts current in the reverse direction.

It is possible that during a test, a switching element is not completely switched off when a current flows in the forward direction, but instead the control signal is changed so as to result in a reduced control voltage (for example, 10 V instead of 15 V). In this case, the voltage drop across the switching element increases (for example, from 1 V to 3 V). Such an increase is the expected response to the decreased control voltage and the actual voltage across the switching element is compared with a reference that encodes the expected response, for example a threshold value of 2 V. The advantage of such a test is that the current can continue to flow during the test. For this reason, the reaction on the load side due to the test is also lower. This allows a longer time for the measurement, i.e. for metrologically recording the expected response.

The method (test method) is preferably carried out via a test device as described here and in the following. In such a method carried out via the test device, an activation signal is output to the control unit by the test device, which causes a change to the control signal. Furthermore, a response to a modified control signal is detected via the test device, in particular via a measuring unit. Furthermore, the test device, in particular an evaluation unit, performs a comparison between an indicator encoding the recorded response to the modified control signal and a reference encoding an expected response to the modified control signal. Finally, depending on the result of the comparison the test device, in particular the evaluation unit, generates a status signal which encodes the functionality of the switching member.

The test device interacts with the switching member to be tested and is an optional component of the switching member, for example by combining the test device with the control unit of the switching member. Such a switching member comprises at least one electrically switchable switching element of the above type, a control unit and a test device as described here and below. A switching state of the or each switching element can be influenced by a control input of the switching element and by a control signal that can be generated by a control unit and output to the control input. The test device can output an activation signal to the control unit, which causes a change to the control signal. The test device, in particular a measuring unit, can also record a response to a modified control signal. Furthermore, the test device, in particular an evaluation unit, can also perform a comparison between an indicator encoding the recorded response to the modified control signal and a reference encoding an expected response to the modified control signal. Finally, depending on the result of the comparison, the test device, in particular the evaluation unit, can generate a status signal which encodes the functionality of the switching member.

An essential advantage of an embodiment of the invention is that it creates the possibility of a reliable evaluation of the functionality of a switching member and the, or at least one, switching device that it comprises. The test can be used, for example, to detect failures due to aging, spontaneous failure of components or overloading, for example due to excessive temperature or voltage, of a switching member at an early stage. This prevents damage due to subsequent faults or production failures due to the failure of the protection or switching function, increases the availability of an electrical system connected to a mains supply, and can also increase the times between maintenance intervals.

Another advantage of an embodiment of the invention is that the test can be carried out during ongoing operation. There is therefore no need to switch off the consumer or any consumer connected to it when performing a test of a switching member. A test of the switching member performed during operation can also be referred to as monitoring of the switching member.

In the test device or the test method, the test device can output an activation signal to the control unit, or an activation signal is output to the control unit, which induces a test signal as the change to the control signal and induces a disconnection pulse as the test signal. Via such a test signal, the switching element to which it is applied is switched off (opened; switched to the non-conductive state) for the duration of the disconnection pulse. This is a defined state of the switching element, which induces a predictable response to the disconnection pulse when the switching element is functioning properly. Such a predictable response is, for example, a build-up of a potential difference across the switching element that is switched off via the disconnection pulse. Such a potential difference or a build-up of such a potential difference is detectable by measurement techniques as a voltage across the switching element or as a voltage change across the switching element, and in an appropriate design is detected as part of the test method or via the test device, for example the measuring unit.

The SiC power semiconductor or the GaN power semiconductor as the switching element is switched off via a disconnection pulse as part of the test method, while the former is conducting current in the reverse direction. In response to the disconnection pulse, the voltage drop across the SiC power semiconductor is recorded and a comparison is performed between an indicator encoding the recorded voltage drop across the SiC power semiconductor or the GaN power semiconductor and a reference encoding an expected response to the disconnection pulse. Depending on the result of the comparison, a status signal is generated which encodes the functionality of the switching element to which the disconnection pulse is applied and thus also the functionality of the switching member as a whole. In a case that is not according to the invention, in which a SiC power semiconductor, IGBT or GaN power semiconductor as the switching element is switched off via a disconnection pulse while it is conducting current in the forward direction, a voltage or a voltage change across the SiC power semiconductor, the IGBT or the GaN power semiconductor is recorded in response to the disconnection pulse and a comparison is made between an indicator encoding the recorded voltage or voltage change and a reference encoding an expected response to the disconnection pulse. Here also, depending on the result of the comparison, a status signal is generated which encodes the functionality of the switching element to which the disconnection pulse is applied and thus also the functionality of the switching member as a whole.

The example embodiment is not to be understood as a limitation of the invention. Rather, within the context of this disclosure, additional features and modifications are also possible which are evident to the person skilled in the art in regard to achieving the object of the invention, in particular those which, for example, by combination or variation of individual features or elements or method steps described in connection with the general or specific description section and contained in the claims and/or the drawing, and which by combinable features lead to new subject matter or to new method steps or sequences of method steps.

Figure 1:
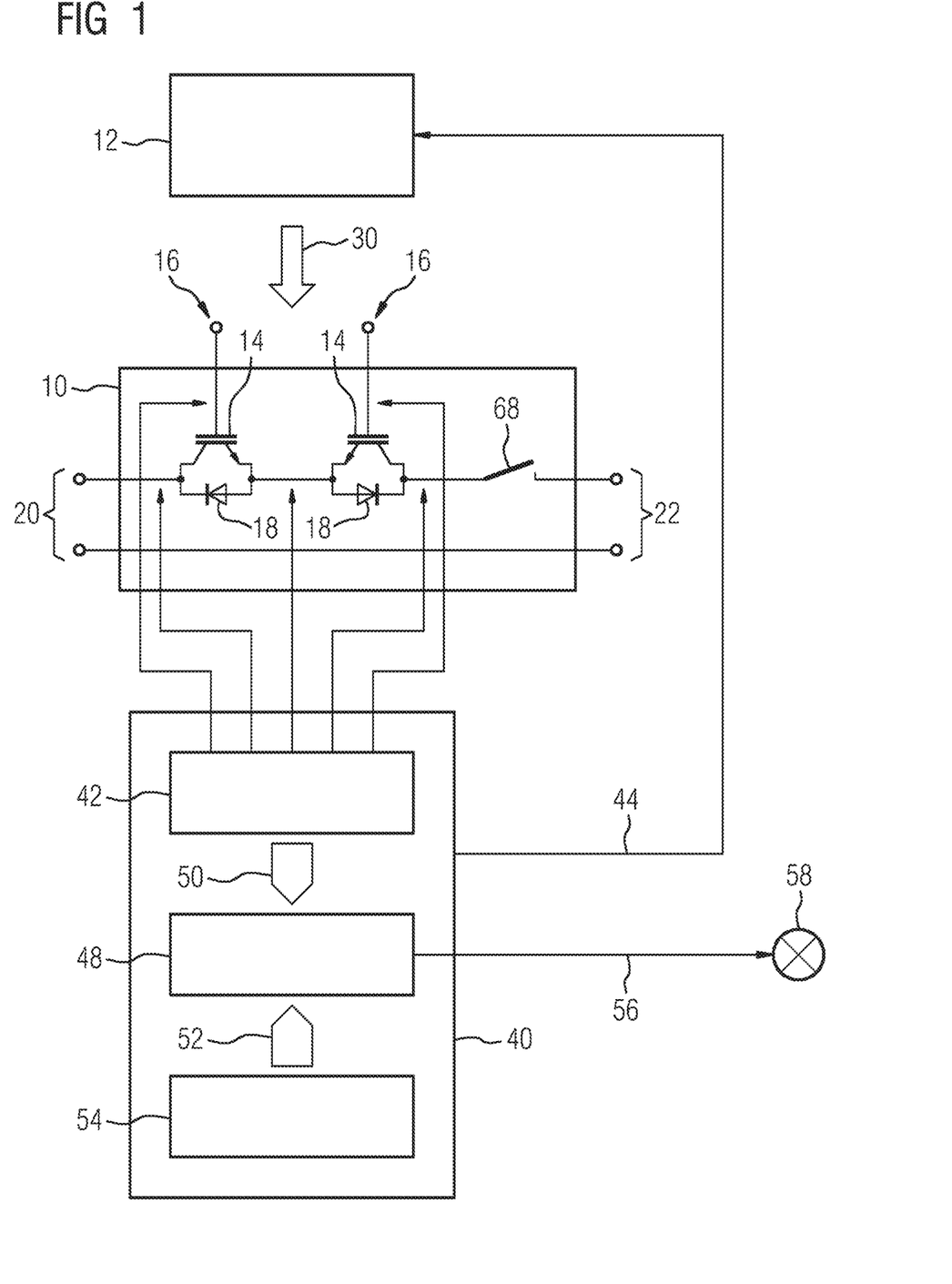
FIG. 1 shows a switching member, here with two electrically switchable switching elements, a control unit, and a test device designed for testing the switching member, namely at least one switching element.

The diagram in FIG. 1 shows an example and simplified schematic of a switching and protection device 10 of the type mentioned above, referred to hereafter in brief as a switching member 10, together with a control unit 12 comprised by the switching member 10 or (as shown) a control unit 12 functionally assigned to the switching member 10.

The switching member 10 comprises at least one electrically controllable switching element 14, for example in the form of an electrically controllable semiconductor switch 14, in particular in the form of a power semiconductor switch 14. Each switching state (conducting, non-conducting) of the or each switching element 14 can be influenced via a control input 16 of the switching element 14.

The diagram in FIG. 1 shows an essentially optional configuration in which a diode 18 is assigned to the or each switching element 14, conducting in the opposite direction to the forward direction thereof, either as an integral part of the component comprising the switching element 14 (body diode) or as an additional component (anti-parallel diode).

On an input side 20 (input 20) formed by input contacts, the switching member 10 can be connected to a supply voltage, in particular a DC voltage, and is connected to a supply voltage during operation. On an output side 22 (output 22) formed by output contacts, a load 24 (FIG. 2) can be connected to the switching member 10 (directly or indirectly) and for operating the load 24 the latter is connected to the switching member 10, in particular via a capacitor 26 (FIG. 2) connected to the output side 22 of the switching member 10 and which can also be part of the load 24, if appropriate, for example in the case of drive units.

The switching member 10 can be controlled via at least one control signal 30, shown in the diagram in FIG. 1 only in simplified schematic form as a block arrow. The control unit 12 generates the or each control signal 30 during operation. In the embodiment shown, the switching member 10 comprises two anti-series switching elements 14. In the case of a switching member 10 with more than one switching element 14, the control unit 12 outputs a control signal 30 for each switching element 14 and each control signal 30 is applied to the control input 16 of a switching element 14. For a control signal 30 which in the case of a switching member 10 with two switching elements 14 places both switching elements 14 in an electrically conducting state, the switching member 10 is bi-directionally conducting overall. For a control signal 30, which in the case of a switching member 10 with two switching elements 14 places exactly one of the switching elements 14 in an electrically conducting state, the switching member 10 is unidirectionally conducting. Instead of a switching member 10 with two anti-series switching elements 14, in principle a switching member 10 with exactly one switching element 14 could also be used. For a control signal 30 which places the switching element 14 of such a switching member 10 in an electrically conducting state, the switching member 10 conducts in the direction determined by the type and connection of the respective switching element 14.

Each time a switching member 10 is mentioned, in the following this also implies a design with exactly one switching element 14 as well as a design with more than one switching element 14, in particular with exactly two switching elements 14.

In order to improve the readability of the rest of the description, this will be continued on the basis of exactly one control signal 30. This is either a control signal 30 for the exactly one switching element 14 of a corresponding switching member 10 or the totality of all control signals 30 for each switching element 14 comprised by a respective switching member 10.

Figure 2:
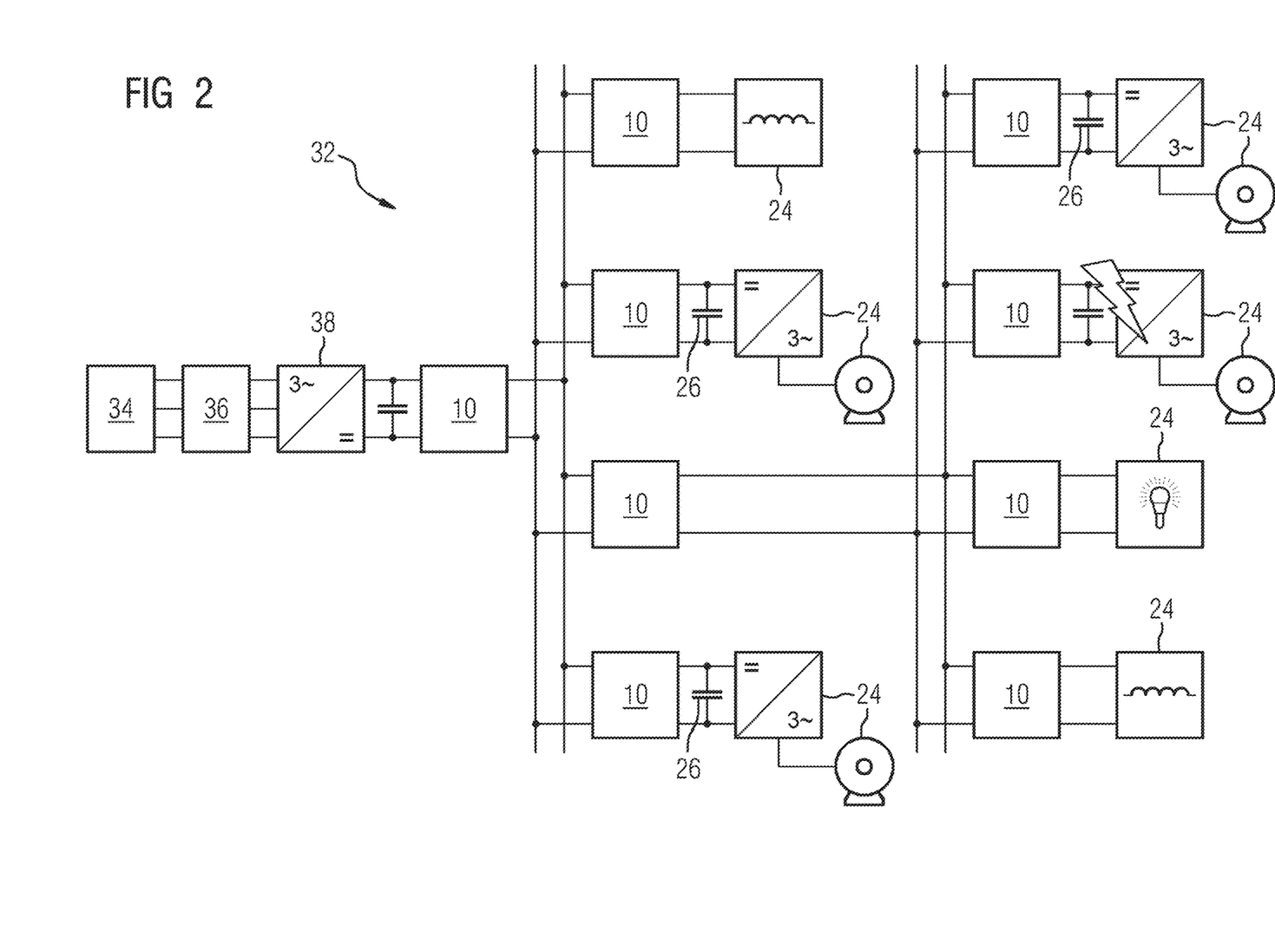
FIG. 2 shows an electrical network with a multiplicity of switching members, in particular switching members according to FIG. 1.

The diagram in FIG. 2 shows a multiplicity of switching members 10, in particular switching members 10 as described above in connection with the explanation of the diagram in FIG. 1, in an example network configuration of a DC voltage network 32, abbreviated in the following as the network 32, which by way of example comprises two network levels. The network 32 is based on an AC voltage network 34, a following AC voltage switching and protection element 36, and a rectifier 38 again connected thereto.

The network 32 comprises different load ranges in each network level, each of which is illustrated by a load 24 (consumer). As examples of a load 24, the diagram in FIG. 2 shows drives with an upstream inverter, a lighting system and heating equipment. In principle, more than one load 24 (more than one consumer) can also be connected in a load range. In the configuration shown, each load range is protected (entirely optionally) via a switching member 10 of the type described above in connection with the explanation of the diagram in FIG. 1. In the configuration shown, such a switching member 10 is also positioned (entirely optionally) between the network levels. Similarly, such a switching member 10 is positioned (entirely optionally) directly following the rectifier 38 where it functions as a kind of infeed point of the DC voltage network 32.

To disconnect a load range from the remaining network 32, the respective switching member 10 is controlled with a control signal 30 (FIG. 1), which induces a switching state of the switching member 10 in which a voltage at the input side vanishes at the output side 22; the switching member is electrically "open". This is referred to below as opening the switching member 10. The switching member 10 opens automatically, for example, if an overcurrent or fault current situation is detected automatically via a sensor system (known per se), not shown in FIG. 1. An opening of the switching member 10 can also be triggered by an external signal if a load range is to be switched off.

In the fault-free case, to connect a load range to a network 32 the respective switching member 10 is controlled with a control signal 30, which induces a switching state of the switching member 10 in which a voltage applied at the input side 20 appears at the output side 22; the switching member is electrically "closed". This is referred to below as closing the switching member 10.

Whether a "high" or a "low" or a positive or a negative potential is required to open or close a switching member 10 and is generated in each case in the intended manner by the control unit 12 as control signal 30, depends in a generally known manner on the type and connection of the or each switching element 14. To simplify matters, the following refers to a control signal 30 for closing a switching member 10 or to a control signal 30 for opening a switching member 10.

In the diagram in FIG. 2, a "lightning bolt" is used to symbolically represent a fault in a load range of the network 32. For example, one possible fault is a short-circuit in a consumer 24. In the event of a fault, the switching member 10 assigned to the affected load range must safely disconnect the load range from the rest of the network 32. For this purpose, the switching member 10 is controlled with a control signal 30 to open the switching member 10. If the switching member 10 is not working properly and does not open the switching member 10 despite such a control signal 30, a safe disconnection of the load range affected by a fault from the rest of the network 32 cannot be guaranteed. Without such disconnection of the load range affected by the fault, in the event of a short circuit, all load ranges in parallel will also be short-circuited and lose their functionality. A proper functioning of each switching member 10 in a respective network 32 is therefore essential for its safe and continuously resilient operation.

A test device 40 (FIG. 1) is provided for testing a switching member 10, in particular each switching member 10 in a network 32 with a multiplicity of consumers (load 24) and/or a multiplicity of load ranges and/or a multiplicity of network levels. The test device 40 is optionally integrated into the control unit 12, unlike in the schematic simplified diagram in FIG. 1.

Via the test device 40, namely a measuring unit 42 comprised by the test device 40 or assigned to the test device 40, at least one characteristic electrical measurement value with respect to the switching member 10 is recorded. An example of a characteristic measurement value is a voltage measurement value that is measured across the, one, or each switching element 14 comprised by the switching member 10. Further examples are voltage measurement values at an input or output of the switching element 14 or a switching element 14 or at the control input 16 of the switching element 14 or a switching element 14. The possible measurements using the measuring unit 42 are illustrated in the diagram in FIG. 1 in schematically simplified form via arrows starting from the measuring unit 42 and pointing to individual possible measuring points. As an alternative to voltage measurements, which optionally also include measurements of voltage waveforms, the measuring unit 42 can optionally be used to perform current measurements, in particular measurements of current waveforms. Optionally, the measuring unit 42 can be used for current and voltage measurements, in particular for measurements of current and voltage waveforms.

As a rule, the required measurement values are already recorded by sensors that are assigned to the control unit 12. In this case, the measurement is carried out by the measuring unit 42 by accessing these measurement values.

The measurement using the measuring unit 42 is carried out under the control of the test device 40. The measurement is temporally correlated with a change to a control signal 30 output by the control unit 12 initiated by the test device 40. A measurement (monitoring of the switching member 10) that is temporally correlated with the change to the control signal 30 means a continuous measurement or a measurement before, during, and/or after the change to the control signal 30, in particular during the change to the control signal 30.

To change the control signal 30, the test device 40 is connected to the control unit 12. In the diagram in FIG. 1, this is shown in a simplified schematic form as a signal path from the test device 40 to the control unit 12. The test device 40 outputs an activation signal 44 to the control unit 12 via this path. Using the activation signal 44, the test device 40 activates a change to the control signal 30 in the control unit 12. The change to the control signal 30 due to an activation signal 44 output by the test device 40 is made during the operation of the switching member 10, i.e. when no switching action is required (due to a short circuit or due to an external switching command) and a constant control signal 30 ("on signal") would thus otherwise be output by the control unit 12.

As an alternative to such an activation signal 44, which triggers the change to the control signal 30 by the control unit 12, it is also feasible for the test device 40 itself to trigger the change to the control signal 30. The control unit 12 then comprises, for example, a controllable voltage source and as the activation signal 44 a voltage generated by the voltage source, in particular a voltage waveform generated by the voltage source, is superimposed on the control signal 30 generated by the control unit 12.

The change to the control signal 30 automatically triggered by the activation signal 44 results in a test signal 46 (FIG. 3), for example a test signal 46 in the form of a short disconnection pulse 46. The test signal 46, in particular a disconnection pulse 46 as a test signal 46, influences the state (conducting, non-conducting) of the or each switching element 14 of the switching member 10.

Figure 3:
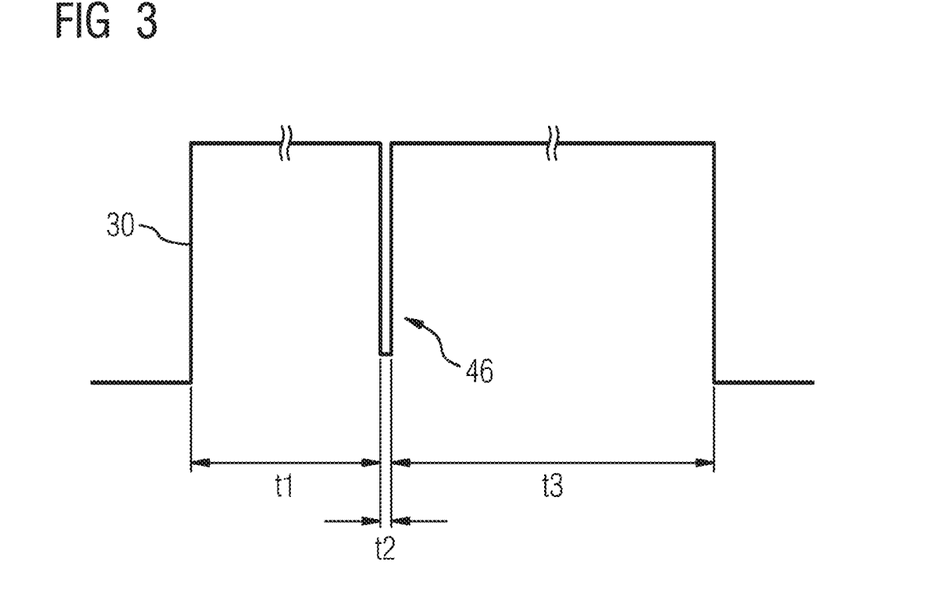
FIG. 3 shows an example of a control signal that can be output by the control unit and a change to the control signal that can be effected by the test device, wherein the change to the control signal acts as a test signal for testing the switching member.

The diagram in FIG. 3 shows an example of a temporal waveform of a control signal 30. In a first time segment T1, this causes the switching member 10 to close. In a second time segment T2, the activation signal 44 is active. The change to the control signal 30 caused by the activation signal 44 occurs there. In the situation shown the change to the control signal 30 is a test signal 46 in the form of a short disconnection pulse 46. This is followed directly, in a third time segment t3, by the "normal", unchanged control signal 30 again. For the duration of a control signal 30—unlike as shown in the schematic simplified diagram in FIG. 3—the activation signal 44 can be active more than once, for example at specified or specifiable times, in particular at equidistant or randomly (pseudo-randomly) selected times.

The rest of the description is based on a test signal 46 in the form of a short disconnection pulse 46 (as shown in FIG. 3), which is produced as a result of a change to the control signal 30 triggered by the activation signal 44. Furthermore, it is assumed that each load 24 consumes electrical power, i.e. the current flows into the load 24. The converse case (different current direction; different current sign) is of course also possible and accordingly always implied.

With a capacitor 26 at the output 22 of the switching member 10, this is charged when the switching member 10 is closed, and when the charging is complete, the voltage at the input 20 of the switching member 10 is present at the output 22. When testing the switching member 10 using a disconnection pulse 46 resulting from the activation signal 44, the switching member 10, i.e. the switching element 14 or the switching element 14 switched in the direction of current flow, is open for the duration of the disconnection pulse 46. When the switching member 10 is open, a connected load 24 is at least briefly supplied by the capacitor 26. The resulting flow of charge out of the capacitor 26 induces an electrical voltage across the switched-off switching element 14. An increase in the voltage across the switched-off switching element 14 and/or an instantaneous voltage across the switched-off switching element 14 can be recorded via the measuring unit 42.

A disconnection pulse 46 resulting from the activation signal 44 for testing the switching member 10 is chosen sufficiently short that the voltage change remains "small". A small voltage change resulting from the disconnection pulse 46 means that the voltage change has no effect (at least no noticeable effect) on the operation of a load 24 connected to the switching member 10 controlled in this way. However, the small voltage change resulting from the disconnection pulse 46 is large enough to be detectable by the measuring unit 42. The voltage change is therefore at least slightly higher than a resolution of the voltage measurement via the measuring unit 42.

In such a situation, to test the switching member 10, i.e. to test the switched-off switching element 14, the voltage or voltage change resulting from the disconnection pulse 46 is recorded as a characteristic electrical measurement value with respect to the switching member 10. The measurement value is evaluated using an evaluation unit 48 comprised by the test device 40 or assigned to the test device 40. For this purpose, an indicator 50 is transmitted from the measuring unit 42 to the evaluation unit 48. The indicator 50 describes the detected voltage or voltage change, for example in the form of an extreme value that occurred during the voltage change. The indicator 50 is compared with a reference 52 by the evaluation unit 48. The reference 52 can be retrieved from a memory 54 assigned to the test device 40 or comprised by the test device 40, where it is retrieved for comparison with the indicator 50. For example, the reference 52 is predefined, i.e. stored as an invariant value in the memory 54. As an alternative, the reference 52 can also be pre-defined, i.e. it can be varied via a parameterization in the memory 54 accessible to a user of the switching member 10.

In the example described above, in which for a properly functioning switching element 14 (i.e. a switching element 14 that is closed due to the control signal 30) it can be assumed that before and after the action of the disconnection pulse 46 only a small voltage determined by the forward characteristics is present across the switching element, and it can also be assumed that the voltage across the switching element 14 opened by the disconnection pulse 46 increases during the action of the disconnection pulse 46, for example, a data point which encodes a voltage value of 3 V can be considered for the reference 52. The increase in the voltage across the open switching element 14 is detected, for example, by taking the difference between the voltage prior to and the voltage in the switched-off mode (open switching element 14). This difference should then be at least 1 V. In the comparison of an indicator 50 encoding the instantaneous voltage across the switching element 14 opened by the disconnection pulse 46 with such a reference 52, the comparison is implemented, for example, as a "greater than or equal" comparison and as soon as the voltage across the switching element 14 opened by the disconnection pulse 46 reaches or exceeds the threshold encoded by the reference 52, the functionality of the switching element 14 to which the disconnection pulse 46 is applied has been ascertained.

The indicator 50 which encodes a voltage or voltage change resulting from an activation signal 44 and/or the or any other electrical variable that can be recorded via the measuring unit 42, can be a single value, for example a (voltage) value, a (voltage) value, a slew rate, a rise time or fall time, etc. The indicator 50 is then a single data point, i.e. a characteristic parameter, and the reference 52 used in the comparison is thus a reference value. The indicator 50 (and accordingly also the reference 52) may also contain more than one data point, for example a combination of the above values or other values describing an electrical signal recorded by the measuring unit 42 which is temporally correlated with the change in the control signal 30.

In the comparison performed automatically via the evaluation unit 48, it is important to determine whether the change in at least one electrical variable that can be detected via the measuring unit 42 as a result of the change to the control signal 30 lies within an expected range. The variable could also be the current. After switching off, the current must immediately become zero.

The reference 52 used as the basis of the comparison by the evaluation unit 48 encodes the expected range or generally, the value(s) expected due to the change to the control signal 30 (due to the test signal 46) in a properly functioning switching member 10 in response to the change to the control signal 30. The reference 52 is accordingly based, for example, on values, for example voltage values, recorded during operation of a properly functioning switching member 10. Optionally, in forming the reference 52 in this way, different properly functioning switching members 10 are taken into account so that at least one value range is obtained as the reference 52. In addition or alternatively, the reference 52, or at least a value range acting as a reference 52, can also be determined empirically, for example via a model of the switching member 10 or of each switching element 14 that it comprises. In general terms, to implement the functional test of the switching member 10 using the evaluation unit 48 and by comparison of the indicator 50 and reference 52, an expected correlation between the modified control signal 30 and the at least one electrical variable recorded by the measuring unit 42 is tested.

To carry out the comparison of indicator 50 and reference 52, the evaluation unit 48, for example, comprises at least one comparator (not shown) or a corresponding functional unit or a corresponding functionality in software and/or firmware. Optionally, the evaluation unit 48 comprises an implementation of more complex evaluation rules, so that, for example, in the event that the current is flowing in the reverse direction through a SiC power semiconductor to be tested, evaluations can be carried out as follows:

If $\{[(U-U1)>K1]$ or $[((U-U1)>Uref)$ and $(t>T1)]\}$
    then [set S1 to High; reset test signal; if (S2=High) then (set S to High) else (leave S1 unchanged; leave S unchanged)]
else
    $\{$if $[(t>K2*I)$ or $(t>tmax)]$
    then (set S1 to Low; set S to Low; reset test signal)
    else (do not change S1; do not change test signal)$\}$
wherein:
U: measured voltage across the switch (between source and drain), i.e. voltage drop across the switch
U1: U before activation of the test signal
K1: constant, e.g. 5 V.
Uref: reference voltage, e.g. 1 V.
t: time since activation of the test signal
t1: waiting time, e.g. 20 µs
tmax: maximum duration of the test signal, e.g. 1 ms
S: status signal (High means that the switching member is functional)
S1: status of the switch to be tested
S2: status of the other switch in the switching member
K2: constant, e.g. 10 µs/A.
I: current in the switching member (from source to drain)

As a result of the comparison, the evaluation unit 48 outputs a status signal 56. In the event of equality, or at least sufficient equality, between the indicator 50 and reference 52—or generally if a condition implemented in the evaluation unit 48 is satisfied—the evaluation unit 48 outputs a status signal 56 which encodes a properly functioning switching member 10. In the event of inequality, or at least insufficient equality, between the indicator 50 and reference 52—or generally if a condition implemented in the evaluation unit 48 is not satisfied—the evaluation unit 48 outputs a status signal 56 which encodes an incorrectly functioning switching member 10. For example, the status signal 56 can be used to control a signal element 58, which informs a user about the functionality of the switching member 10, for example an optical signal element, in particular a status LED, and/or an acoustic signal element. In addition or alternatively, the status signal 56 can also be forwarded to a higher-level unit (not shown), for example a unit for monitoring the respective network 32 and the switching members 10 it comprises, and evaluated there. An evaluation of the status signal 56 there comprises, for example, a status display corresponding to the status signal 56 on a display screen or similar.

The switching element(s) 14 of a switching member 10 can in principle be any semiconductor switch, in particular power semiconductors, for example MOSFETs, IGBTs etc.

With IGBTs as the switching element 14, i.e. IGBTs with an anti-parallel diode (anti-parallel diode 18), the test is carried out when the current flows in the forward direction (i.e. through the IGBT). If the IGBT is switched off due to a corresponding activation signal 44 and via a resulting disconnection pulse 46, the voltage across the switching element 14 and the switching member 10 as a whole increases as described above, because in a DC network there are capacitances present on both sides of the switching member 10, for example, the capacitance of the capacitor 26 at the output 22 of the switching member 10. The voltage increases with finite speed. The duration of a disconnection pulse 46 resulting from the activation signal 44 is chosen to be short enough that the voltage change remains small (only slightly higher than the resolution range of the voltage measurement).

The method described for IGBTs as the switching element 14 is also applicable for all types of power semiconductors, in particular also for SiC-MOSFETs.

In the case of a switching member 10 with at least one SiC power semiconductor (silicon carbide semiconductor) as the switching element 14, the current can flow in the reverse direction via the diode 18 (body diode) and/or the channel of the MOSFET switched in the reverse direction. The latter is only the case when the MOSFET is switched on. A current flow through the MOSFET gives rise to lower losses (a lower voltage across the switching element 14) than a current flow through the body diode, because the forward voltage of the body diode, i.e. the voltage drop across the body diode, is around 3 V and thus significantly higher than that of the MOSFET (assuming a standard design). The current direction and the voltage drop across the switching element 14 are evaluated as part of the test. The MOSFET, which is currently conducting current in the reverse direction, is switched off due to a corresponding activation signal 44 and via a resulting disconnection pulse 46. If the MOSFET is controllable, this will cause the voltage drop across the MOSFET to increase to 3 V. If the control channel is defective or the MOSFET has a short circuit or is not conducting, it remains constant. This is tested using the evaluation unit 48 as described above. It is sufficient to detect the total voltage drop across two switching elements 14 connected in series as shown in FIG. 1 by measuring across the two switching elements 14 or by taking the difference between a voltage measured at the input 20 and at the output 22. The requirement on the absolute accuracy of the voltage detection is low because only the change in the voltage needs to be evaluated.

For SiC-MOSFETs, which due to their low forward resistance are particularly well suited for use in a switching member 10 of the type described here, a test of each switching element 14 is therefore always possible regardless of the current direction.

In GaN switches also, the current can flow in the reverse direction and the voltage drop in this operational case is smaller when the on-signal is applied. They therefore behave in a similar way to SiC-MOSFETs and can be monitored in the same way.

Instead of the example disconnection pulse 46 shown in FIG. 3, the test signal 46 can in principle be any signal which, if the switching member 10 is functioning correctly, causes a measurable change to an electrical variable that can be detected by the measuring unit 42.

Via an optional measurement of the current through the switching member 10, further information is available which, as a result of an automatic evaluation in the form of a comparison of a corresponding indicator 50 with a reference 52, allow conclusions as to a possibly complex-valued, time-varying resistance characteristic and thus the functionality of the switching member 10. For example, when a switching element 14 that is conducting in the forward direction is switched off, the current immediately becomes zero. If this is not the case and a measurable current continues to flow, a deviation from an expected range exists with respect to the measured current. The current measurement is carried out via a current sensor (not shown), comprised by the measuring unit 42, for example. Optionally, more than one current meter is present so that current measurement is possible at multiple measuring points, for example at some or all of the measuring points mentioned in the diagram in FIG. 1 for the voltage measurement described above.

Depending on the characteristics of the or each switching element 14, the data of the voltage and current measurement will have a different degree of correlation, so that the measurement data can be applied individually and/or together as the basis for an improved determination of the functionality of the switching member 10. A plausibility check is carried out, for example, in the form of a comparison of voltage and current measurements. Since practically every load 24 connected directly or indirectly to a switching member 10 has a capacitive character, a time-varying change in the voltage is associated with a change in the current and a time-varying change in the current is associated with a voltage change. A lack of correlation according to expectation indicates an improperly functioning switching member 10. An expected correlation is represented by the reference 52.

Consequently, multiple measurement data from different measurements can be used to detect errors in a measurement or measuring point by evaluation and thus perform a plausibility check of the measurements against one another.

The test—that is, the triggering of the activation signal 44, the detection of at least one electrical variable temporally correlated to the activation signal 44 and by the measuring unit 42, as well as the comparison of indicator 50 and reference 52—can be triggered and performed by the test device 40 automatically. In addition or alternatively, such a test can be initiated externally by an appropriate activation of the test device 40. In both cases, the test can be triggered periodically, for example at specified or specifiable times, in particular equidistant times, or randomly (pseudo-randomly).

Figure 4:
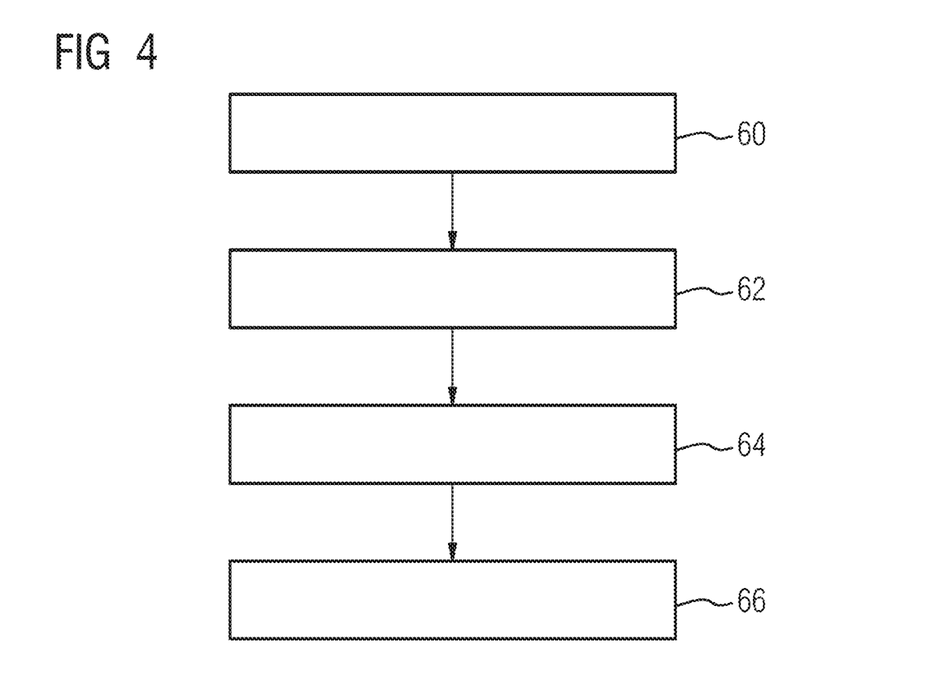
FIG. 4 shows a simplified schematic representation of a method for testing a switching member according to FIG. 1 or a switching member with at least one electrically switchable switching element.

Finally, the illustration in FIG. 4 shows an example flow diagram of the method proposed here for automatically testing a switching member 10 comprising at least one switching element 14 and designed for protection in an electrical network 32. The method is implemented in hardware or firmware, for example, via an FPGA or similar, or in firmware and software, or in software.

In a first step 60, the activation signal 44 is triggered. As described above, the activation signal 44 induces a change in the control signal 30 previously output by the control unit 12. In a second step 62, a response to the modified control signal 30 and/or effects of the modified control signal 30 on the switching element 14 or at least one switching element 14 are recorded. Both of these are collectively referred to as the response. The response is recorded using the measuring unit 42. In a third step 64, the response is evaluated. The evaluation is carried out via the evaluation unit 48, by comparing an indicator 50 encoding the actual response with a reference 52 encoding an expected response. In a fourth step 66, depending on the result of the comparison, a status signal 56 is generated, for example, which is optionally forwarded to a higher-level unit.

A response triggered by the test device 40 in the fourth step 66 as a result of the comparison can also comprise disconnection of the switching member 10, for example by a corresponding control of the or each switching element 14 and/or by opening an additional switch 68 of the switching member 10. Errors are reported, for example, via a display on the test device 40 and/or via a device interface (terminal strip, fieldbus, optical signal). If an error is detected, the affected load range can be automatically disabled (pulsed inhibition or switching off of all loads 24) and isolated.

Finally, the approach proposed here can be briefly summarized as follows: a method is specified for automatically testing the functionality of a switching member 10 comprising at least one electrically switchable switching element 14, in particular as a method for operating the test device 40 or the switching member 10 comprising a test device 40. A test device refers to a device for carrying out the method, wherein the test device 40 is used for automatically testing the functionality of a switching member 10 comprising at least one electrically switchable switching element 14. In the switching member 10 a switching state of the or each switching element 14 can be influenced by a control input 16 of the switching element 14 and via a control signal 30 that can be generated by a control unit 12 and output to the control input 16. As part of the method, in particular via the test device 40, an activation signal 44 can be output to the control unit 12, which causes a change to the control signal 30. As part of the method, in particular via the test device 40, a response to a modified control signal 30 can be recorded. Furthermore, as part of the method, in particular via the test device 40, a comparison can also be performed between an indication 50 encoding the recorded response to the modified control signal 30 and a reference 52 encoding an expected response to the modified control signal 30. Finally, as part of the method, in particular via the test device 40, a status signal 56 depending on the result of the comparison can be generated and output which encodes the functionality of the switching member 10. The status signal 56, or a signal element 58 or the like controlled on the basis of the status signal 56, indicates the functionality of the switching member 10.

The invention claimed is:

1. A method for automatically testing functionality of a switching member including at least one electrically switchable switching element, a switching state of the at least one electrically switchable switching element being influenceable via a control input of the at least one electrically switchable switching element and via a control signal generatable by a controller and output to the control input and the at least one switching element including a Silicon Carbide (SiC) power semiconductor or a Gallium Nitride (GaN) power semiconductor, the method comprising:
    outputting an activation signal to the controller to change the control signal, the activation signal inducing a test signal as the change to the control signal and inducing a disconnection pulse as the test signal;
    recording, in response to the disconnection pulse, a voltage drop across the switching element;
    carrying out a comparison between an indicator, encoding the voltage drop recorded across the switching element, and a reference, encoding an expected response to the disconnection pulse;
    generating, depending on a result of the comparison, a status signal encoding the functionality of the switching member; and
    switching off the SiC power semiconductor or GaN power semiconductor via the disconnection pulse, while the SiC power semiconductor or GaN power semiconductor conducts current in a reverse direction.

2. A test device for automatically testing functionality of a switching member including at least one electrically switchable switching element, a switching state of the at least one electrically switchable switching element being influenceable via a control input of the at least one electrically switchable switching element and via a control signal generatable by a controller and output to the control input, the at least one switching element including a Silicon Carbide (SiC) power semiconductor or a Gallium Nitride (GaN) power semiconductor, the test device being configured to output an activation signal to the controller, the controller being configured to change the control signal, the activation signal being configured to induce a test signal as the change to the control signal and induce a disconnection pulse as the test signal; record, in response to the disconnection pulse, the test device a voltage drop across the at least one switching element; carryout a comparison between an indicator, encoding the voltage drop recorded across the at least one switching element, and a reference, encoding an expected response to the control signal as changed; and generate, depending on a result of the comparison, a status signal which encodes the functionality of the at least one switching member; and switch off the SiC power semiconductor or the GaN power semiconductor via the disconnection pulse, while the SiC power semiconductor or GaN power semiconductor conducts current in a reverse direction.

* * * * *